(12) United States Patent
Kang

(10) Patent No.: US 12,041,780 B2
(45) Date of Patent: Jul. 16, 2024

(54) SEMICONDUCTOR DEVICE AND METHOD OF MANUFACTURING THE SEMICONDUCTOR DEVICE

(71) Applicant: SK hynix Inc., Icheon-si (KR)

(72) Inventor: Jeong Sang Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 390 days.

(21) Appl. No.: 17/546,561

(22) Filed: Dec. 9, 2021

(65) Prior Publication Data

US 2023/0032560 A1 Feb. 2, 2023

(30) Foreign Application Priority Data

Jul. 28, 2021 (KR) .................. 10-2021-0099352

(51) Int. Cl.
| | |
|---|---|
| *H10B 43/40* | (2023.01) |
| *H01L 23/535* | (2006.01) |
| *H01L 49/02* | (2006.01) |
| *H10B 41/27* | (2023.01) |
| *H10B 41/41* | (2023.01) |
| *H10B 43/27* | (2023.01) |

(52) U.S. Cl.
CPC ........... *H10B 43/40* (2023.02); *H01L 23/535* (2013.01); *H01L 28/60* (2013.01); *H10B 41/27* (2023.02); *H10B 41/41* (2023.02); *H10B 43/27* (2023.02)

(58) Field of Classification Search
None
See application file for complete search history.

(56) References Cited

U.S. PATENT DOCUMENTS

| | | | |
|---|---|---|---|
| 2013/0049086 A1* | 2/2013 | Ahn | H01L 28/90 257/296 |
| 2015/0318296 A1* | 11/2015 | Kim | H10B 41/40 257/296 |
| 2018/0269203 A1* | 9/2018 | Nojima | H01L 28/60 |
| 2019/0157291 A1* | 5/2019 | Kam | G11C 16/08 |
| 2020/0312861 A1* | 10/2020 | Kim | H10B 43/10 |
| 2020/0411507 A1* | 12/2020 | An | H10K 59/88 |
| 2022/0068796 A1* | 3/2022 | Guo | H10B 41/41 |

FOREIGN PATENT DOCUMENTS

| | | |
|---|---|---|
| KR | 1020190058157 A | 5/2019 |
| KR | 1020210002217 A | 1/2021 |

* cited by examiner

*Primary Examiner* — Evren Seven
(74) *Attorney, Agent, or Firm* — WILLIAM PARK & ASSOCIATES LTD.

(57) ABSTRACT

Provided herein may be a semiconductor device and a method of manufacturing the semiconductor device. The semiconductor device may include a dummy stacked body including a plurality of first material layers and second material layers alternately stacked in a contact area, at least one contact plug formed to vertically pass through a portion or an entirety of the dummy stacked body, and a capacitor comprising a first electrode body and a second electrode body, the first and second electrode bodies formed around the at least one contact plug and vertically passed through a portion or an entirety of the dummy stacked body.

10 Claims, 20 Drawing Sheets

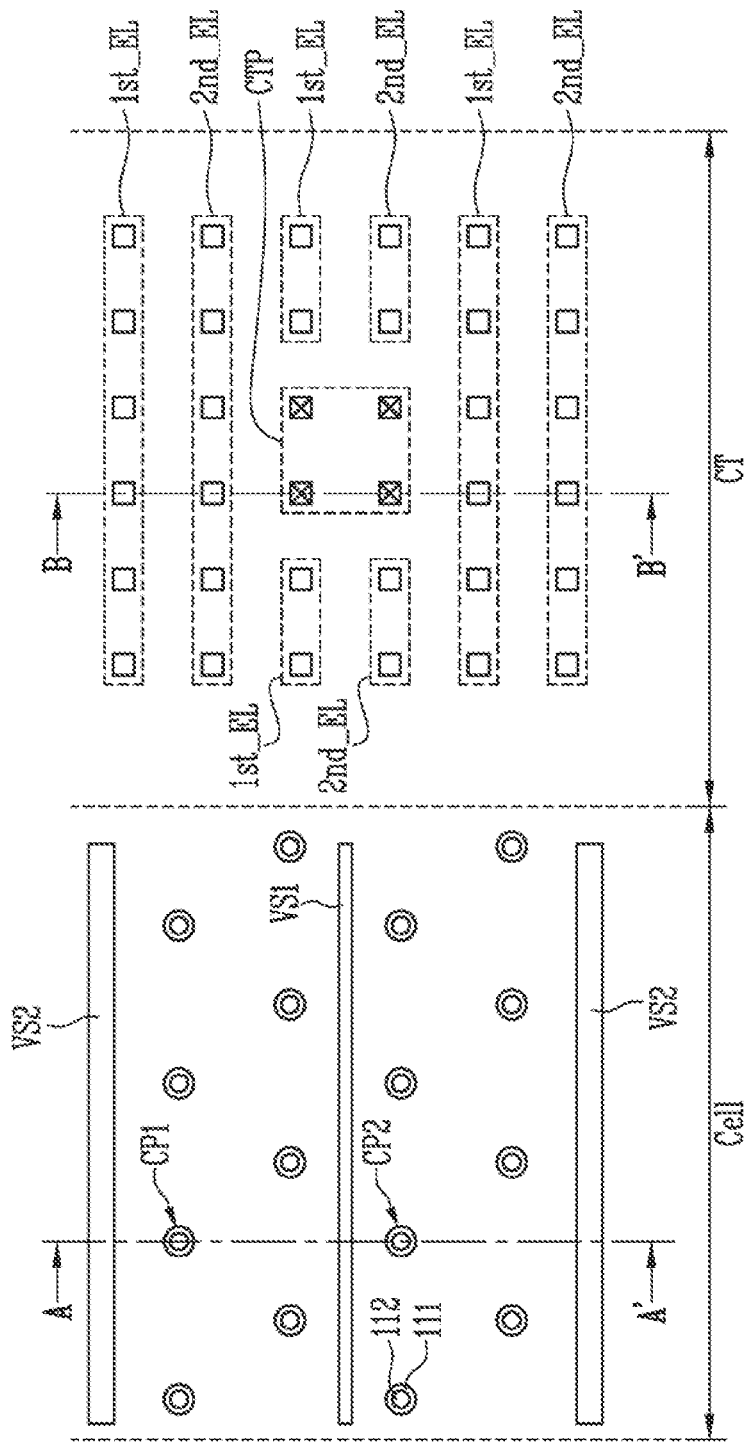

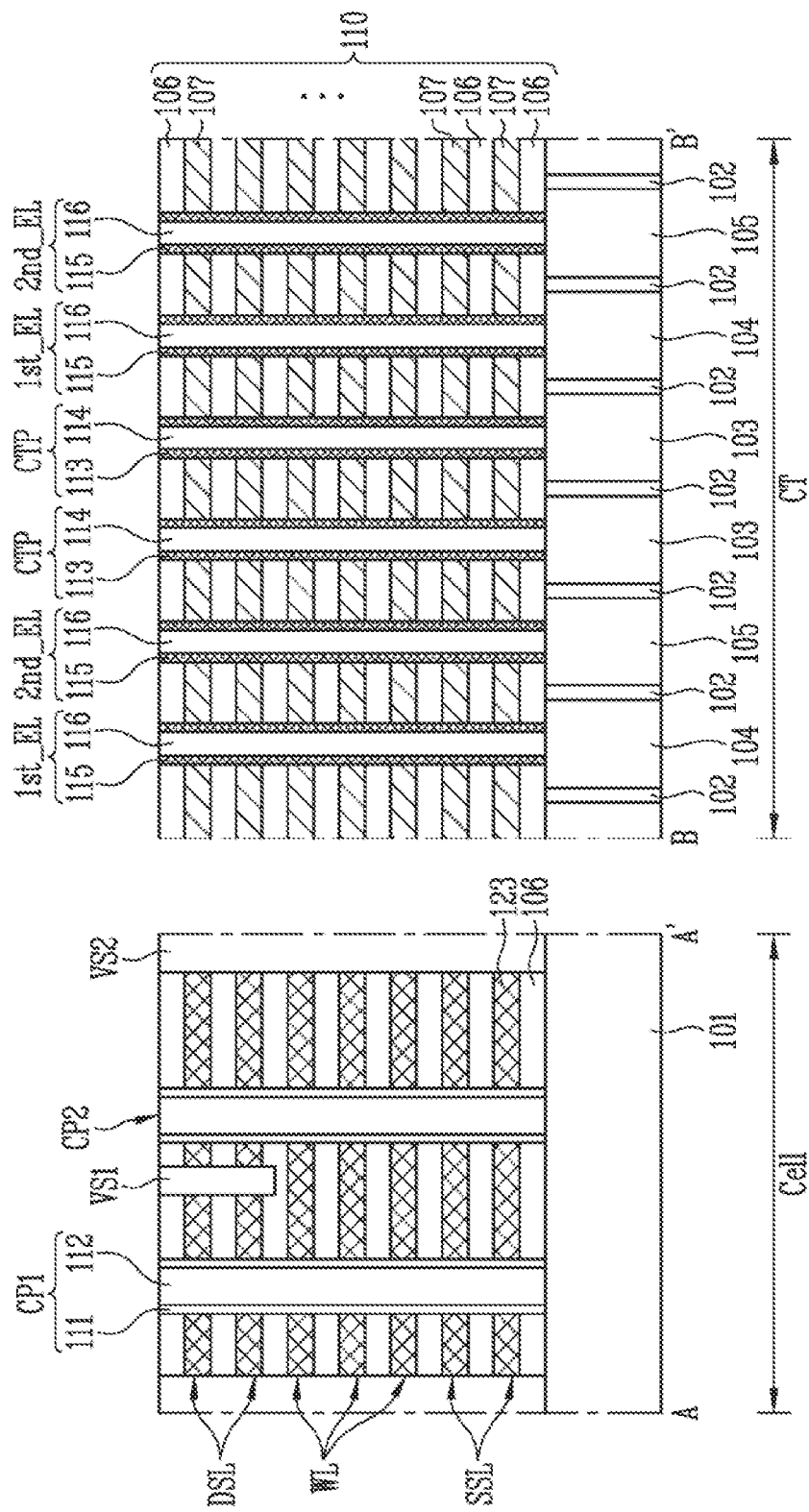

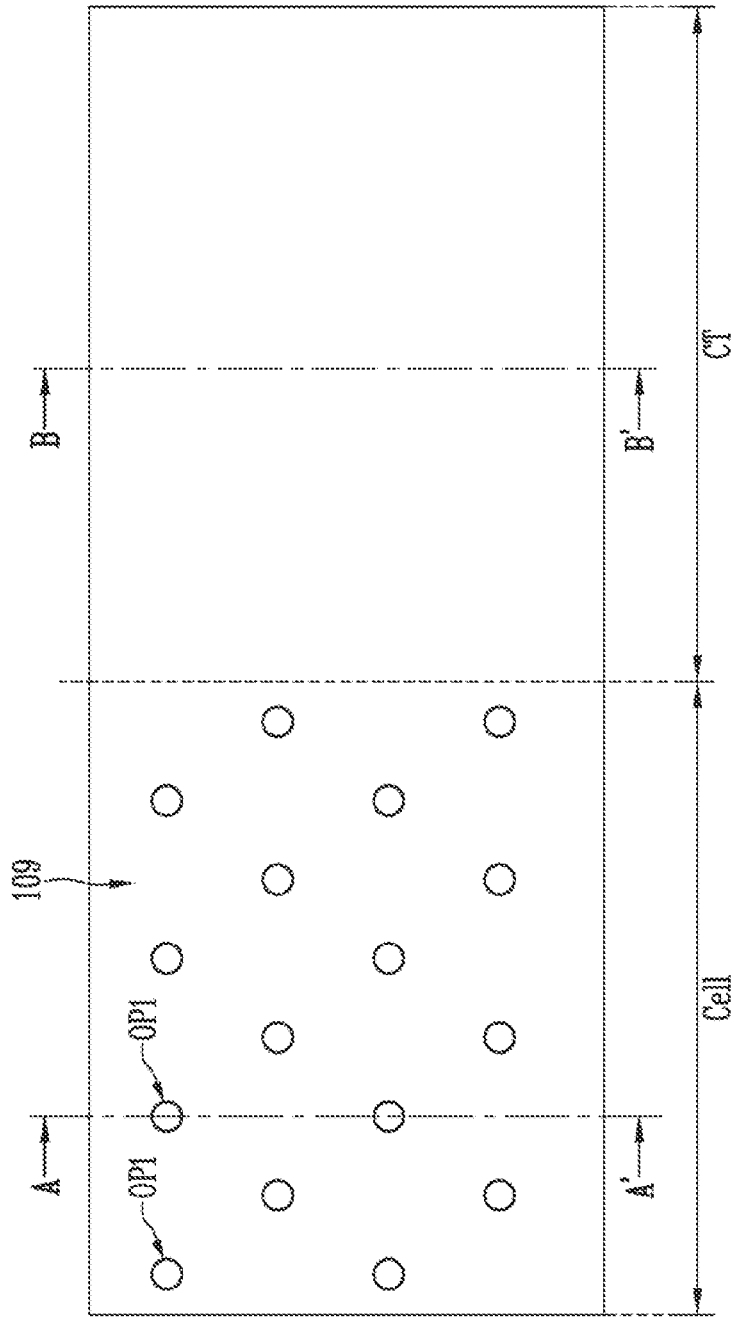

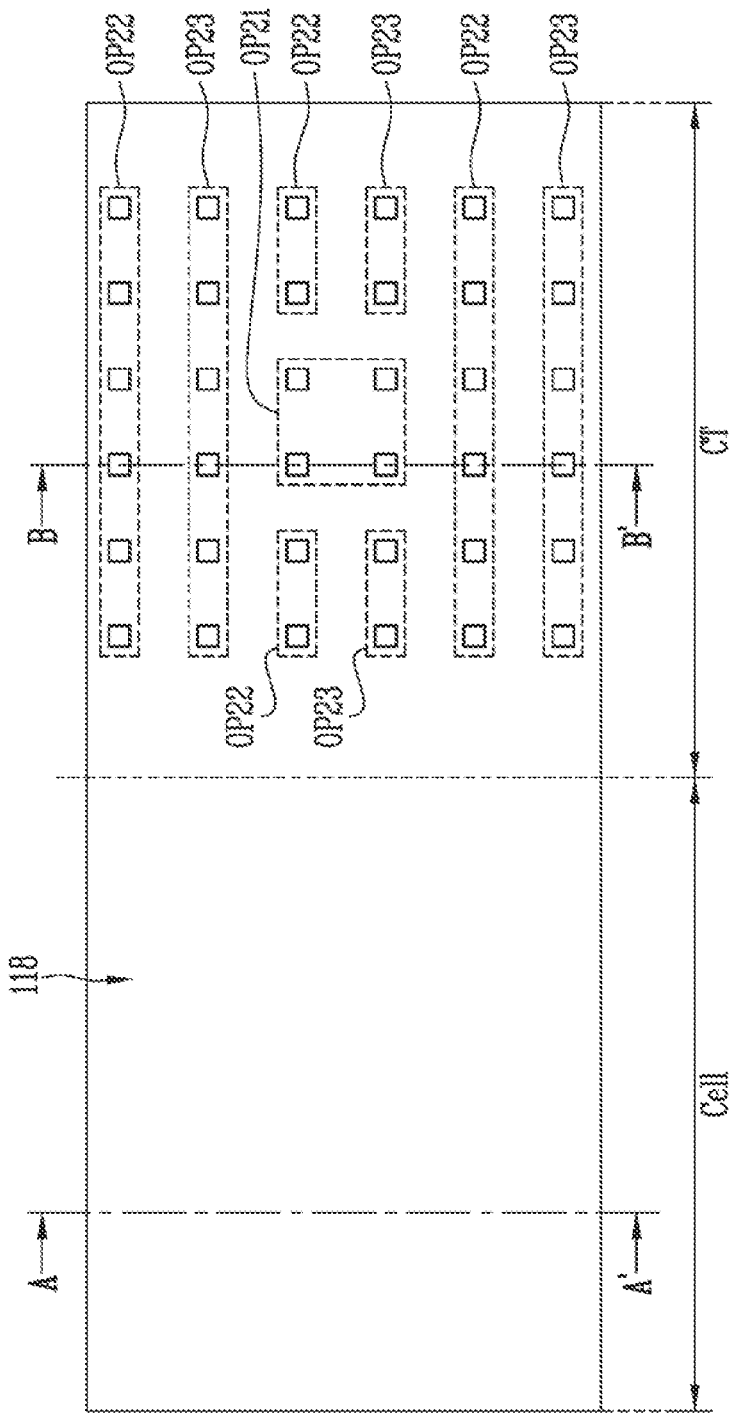

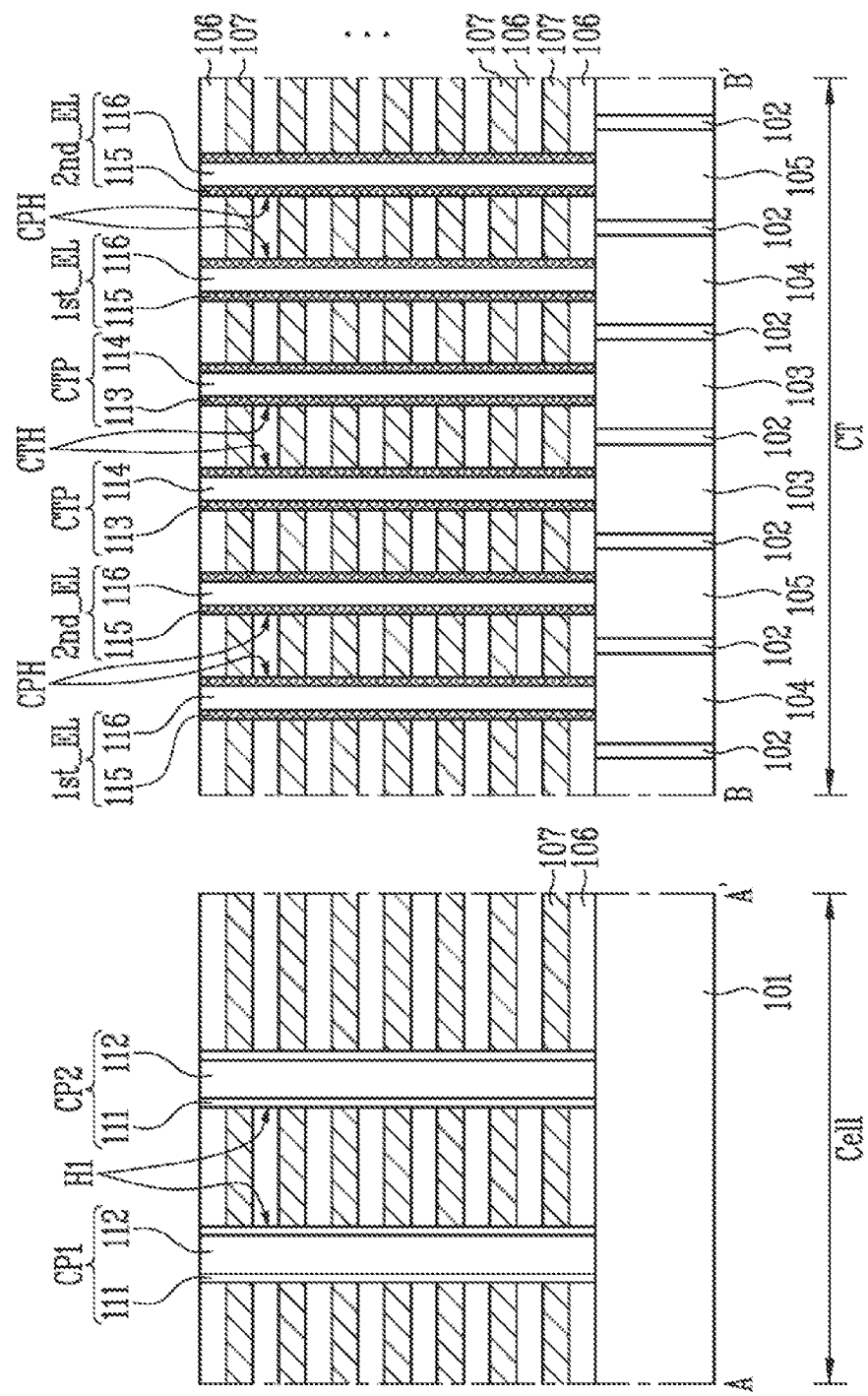

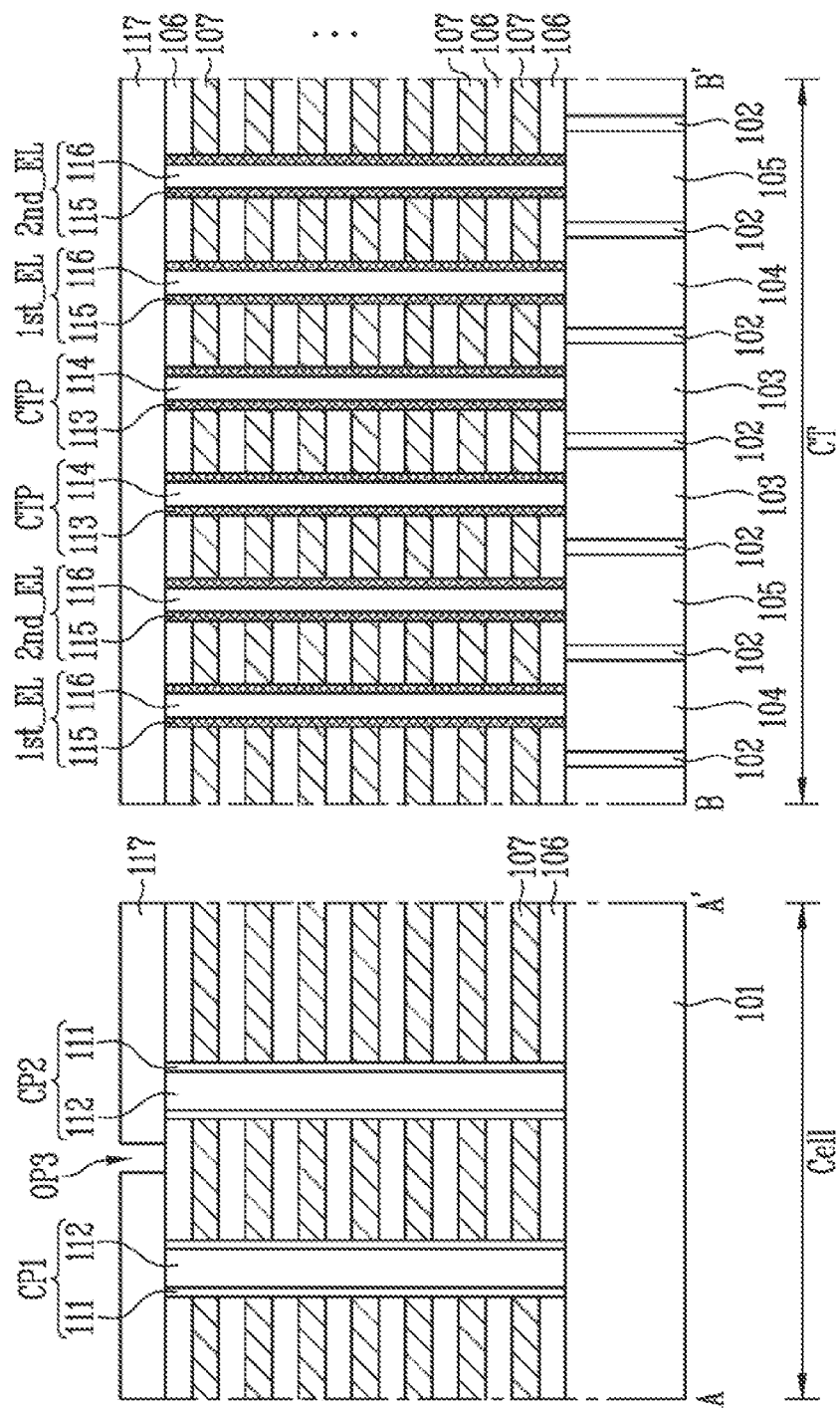

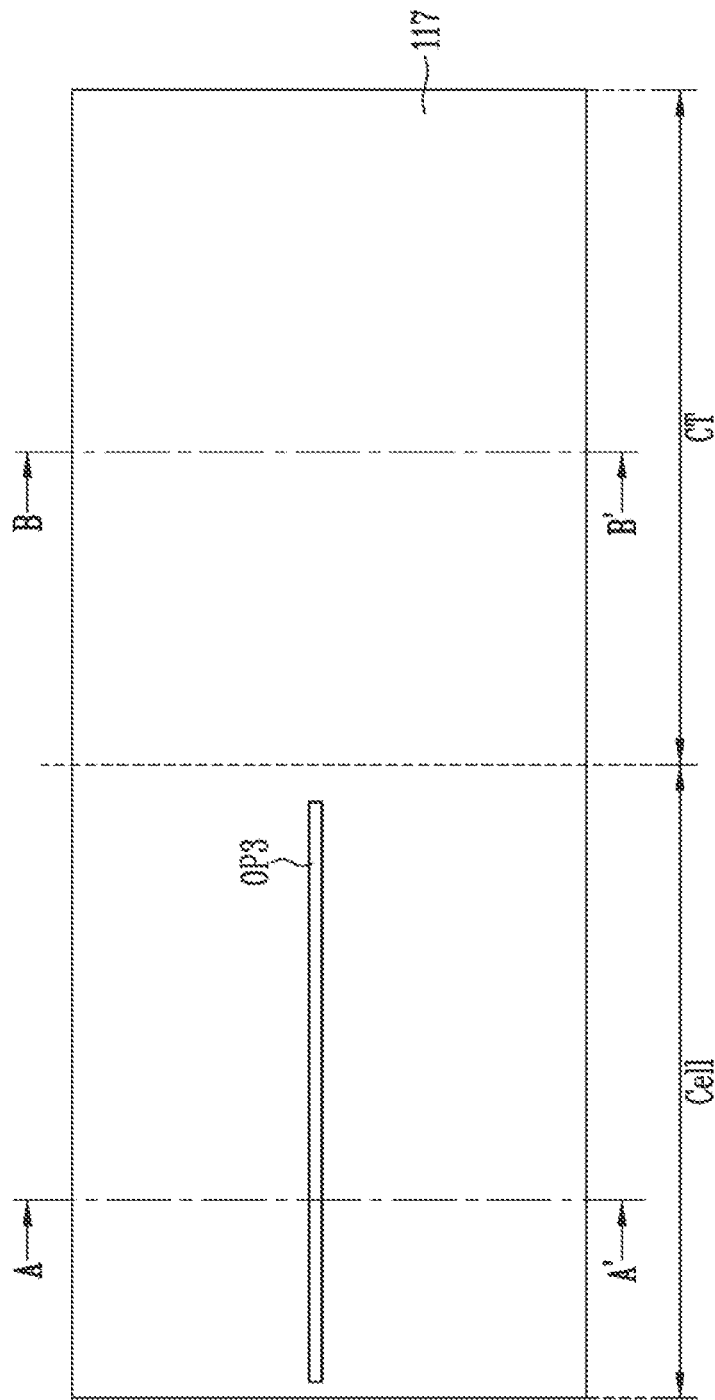

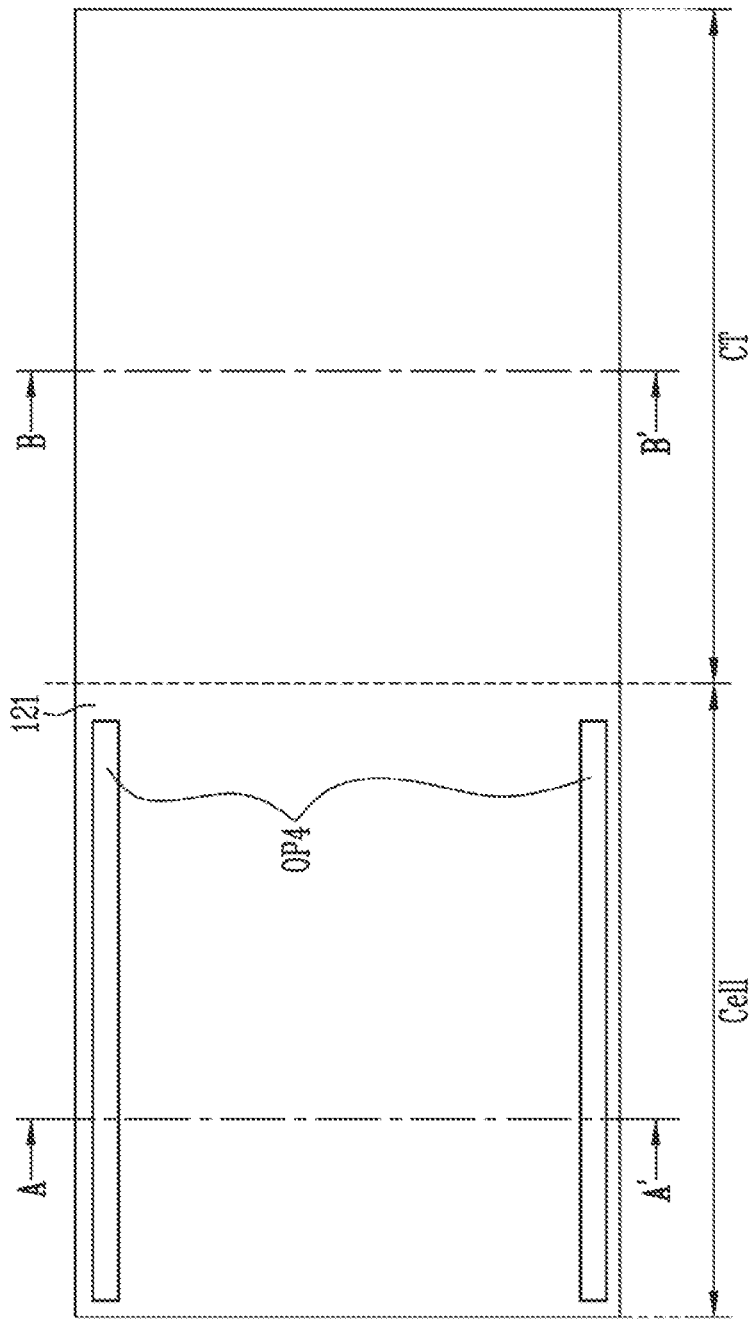

SEMICONDUCTOR DEVICE AND METHOD OF MANUFACTURING THE SEMICONDUCTOR DEVICE

CROSS-REFERENCE TO RELATED APPLICATION

The present application claims priority under 35 U.S.C. § 119(a) to Korean patent application number 10-2021-0099352, filed on Jul. 28, 2021, in the Korean Intellectual Property Office, the entire disclosure of which is incorporated herein by reference.

BACKGROUND

1. Technical Field

Various embodiments of the present disclosure generally relate to an electronic device, and more particularly to a semiconductor device and a method of manufacturing the semiconductor device.

2. Related Art

A nonvolatile memory device is a memory device which retains stored data even when the supply of power is interrupted. Recently, as a two-dimensional (2D) nonvolatile memory device in which memory cells are formed on a substrate in a single layer is reaching its physical scaling limit, three-dimensional (3D) nonvolatile memory devices including memory cells vertically stacked on a substrate have been proposed.

Such a 3D nonvolatile memory device may include interlayer insulating layers and gate electrodes that are alternately stacked on top of one another, and channel layers passing through the interlayer insulating layers and the gate electrodes, with memory cells stacked along the channel layers. To improve the operation& reliability of such a nonvolatile memory device having a 3D structure, various structures and manufacturing methods have been developed.

SUMMARY

In an embodiment of the present disclosure a semiconductor device may include a dummy stacked body including a plurality of first material layers and second material layers alternately stacked in a contact area, at least one contact plug formed to vertically pass through a portion or an entirety of the dummy stacked body, and a capacitor comprising a first electrode body and a second electrode body, the first and second electrode bodies formed around the at least one contact plug and vertically passed through a portion or an entirety of the dummy stacked body.

In an embodiment of the present disclosure a method of manufacturing a semiconductor device may include forming a stacked body by alternately stacking a first material layer and a second material layer in a contact area of a semiconductor substrate, forming at least one contact hole and a plurality of capacitor electrode holes that pass through a portion or an entirety of the stacked body, and forming a contact plug by filling the contact hole with a conductive material, and forming a capacitor comprising a first electrode body and second electrode body by filling the plurality of capacitor electrode holes with the conductive material.

BRIEF DESCRIPTION OF THE DRAWINGS

FIGS. 3A and 3B are a plan view and a sectional view, respectively, illustrating a semiconductor device according to an embodiment of the present disclosure.

FIGS. 4, 5A, 5B, 6A, 6B, 7, 8A, 8B, 9, 10A, and 10B are sectional views and plan views illustrating a method of manufacturing a semiconductor device according to an embodiment of the present disclosure.

DETAILED DESCRIPTION

Specific structural or functional descriptions in the embodiments of the present disclosure introduced in this specification or application are provided for examples to describe embodiments according to the concept of the present disclosure. The embodiments according to the concept of the present disclosure may be practiced in various forms, and should not be construed as being limited to the embodiments described in the specification or application.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Various embodiments of the present disclosure will now be described hereinafter with reference to the accompanying drawings.

Various embodiment of the present disclosure may be directed to a semiconductor device in which capacitors are disposed in a contact area and a method of manufacturing the semiconductor device.

Figure 1A:
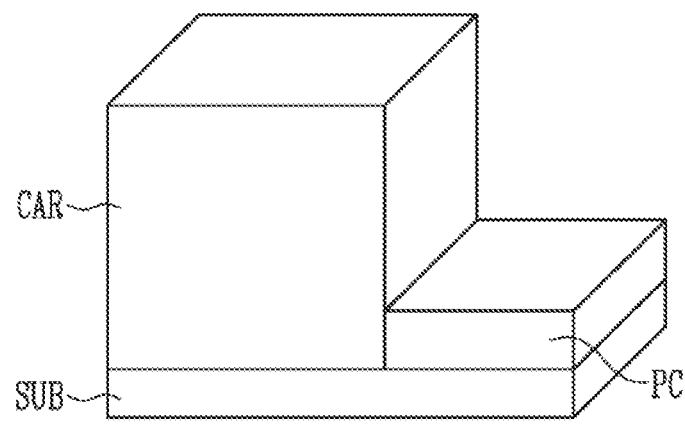
FIGS. 1A and 1B are perspective views schematically illustrating semiconductor devices according to embodiments of the present disclosure.
Figure 1B:
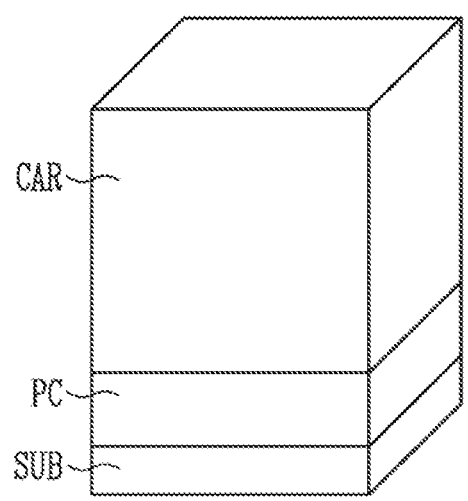

FIGS. 1A and 1B are perspective views schematically illustrating semiconductor devices according to embodiments of the present disclosure.

Referring to FIGS. 1A and 1B, each of the semiconductor devices according to embodiments of the present disclosure may include a peripheral circuit structure PC and a cell array CAR that are arranged on a substrate SUB.

The substrate SUB may be a single-crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film substrate formed using a selective epitaxial growth method.

The cell array CAR may include a plurality of memory blocks. Each of the memory blocks may include a plurality of cell strings. Each of the cell strings is electrically connected to a bit line, a source line, word lines, and select lines. Each of the cell strings may include memory cells and select transistors which are connected in series to each other. Each of the select lines may be used as a gate electrode of a select transistor corresponding thereto, and each of the word lines may be used as a gate electrode of a memory cell corresponding thereto.

The peripheral circuit structure PC may include NMOS transistors and PMOS transistors, a resistor, and a capacitor which are electrically connected to the cell array CAR. The NMOS and PMOS transistors, the resistor, and the capacitor may be used as elements constituting a row decoder, a column decoder, a page buffer, and a control circuit.

As illustrated in FIG. 1A, the peripheral circuit structure PC may be disposed in a partial region of the substrate SUB that does not overlap the cell array CAR.

Alternatively, as illustrated in FIG. 1B, the peripheral circuit structure PC may be disposed between the cell array CAR and the substrate SUB. In this case, since the peripheral circuit structure PC overlaps the cell array CAR, the area of the substrate SUB occupied by the cell array CAR and the peripheral circuit structure PC can be reduced.

Figure 2:
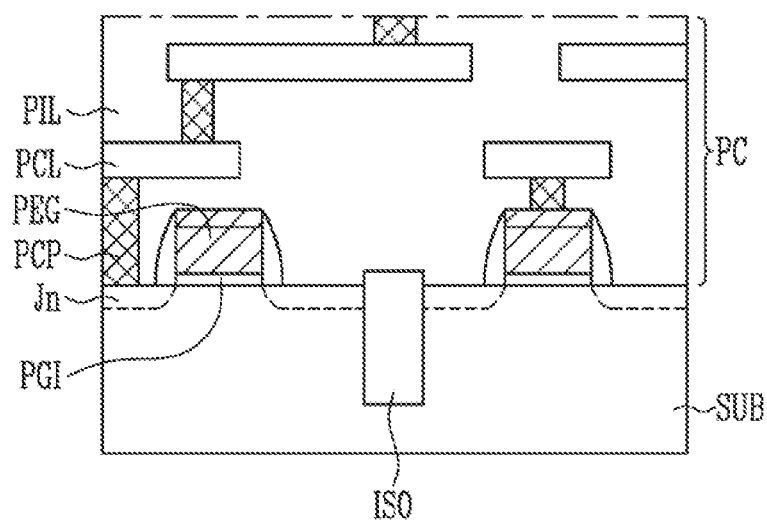
FIG. 2 is a sectional view schematically illustrating a peripheral circuit structure.

FIG. 2 is a sectional view schematically illustrating a peripheral circuit structure.

The peripheral circuit structure PC illustrated in FIG. 2 may be included in the peripheral circuit structure illustrated in FIG. 1A, or may be included in the peripheral circuit structure illustrated in FIG. 1B.

Referring to FIG. 2, the peripheral circuit structure PC may include peripheral gate electrodes PEG, peripheral gate insulating layers PGI, junctions Jn, peripheral circuit lines PCL, and peripheral contact plugs PCP. The peripheral circuit structure PC may be covered with a peripheral circuit insulating layer PIL formed on the substrate SUB.

The peripheral gate electrodes PEG may be used as gate electrodes of NMOS transistors and PMOS transistors of the peripheral circuit structure PC. The peripheral gate insulating layers PGI may be disposed between the respective peripheral gate electrodes PEG and the substrate SUB.

The junctions Jn, which are regions defined by injecting n-type or p-type impurities into the active area of the substrate SUB, may be disposed on both sides of each of the peripheral gate electrodes PEG, and may be used as source junctions or drain junctions. The active area of the substrate SUB may be defined by an isolation layer ISO formed in the substrate SUB. The isolation layer ISO is made of an insulating material.

The peripheral circuit lines PCL may be electrically connected to transistors, a resistor, and a capacitor, which constitute the circuit of the peripheral circuit structure PC, through the peripheral contact plugs PCP.

The peripheral circuit insulating layer PIL may include insulating layers stacked in a multi-layer structure.

FIGS. 3A and 3B are a plan view and a sectional view, respectively, illustrating a semiconductor device according to an embodiment of the present disclosure.

Referring to FIG. 3A, the cell array (e.g., CAR of FIGS. 1A and 1B) of the semiconductor device may include a cell area Cell and a contact area CT, In the cell area Cell, a plurality of channel plugs CP1 and CP2 may be regularly arranged. Further, a first vertical structure VS1 having a linear shape, disposed between the plurality of channel plugs CP1 and CP2, may be arranged in a central portion of the cell area Cell, and second vertical structures VS2 may be arranged at both ends of the cell area Cell. The plurality of channel plugs CP1 and CP2 may be disposed between the second vertical structures VS2. Each of the plurality of channel plugs CP1 and CP2 may include a channel layer 112 and a memory layer 111 enclosing the channel layer 112. The first vertical structure VS1 and the second vertical structures VS2 may be insulating layers, and may be formed of, for example, oxide layers.

In the contact area CT, one or more contact plugs CTP may be arranged. Further, in the contact area CT, one or more first electrode bodies 1st_EL for capacitors and one or more second electrode bodies 2nd_EL for capacitors may be arranged. The first electrode bodies 1st_EL for capacitors and the second electrode bodies 2nd_EL for capacitors may be arranged to enclose the perimeter of the contact plugs CTP, The first electrode bodies 1st_EL for capacitors and the second electrode bodies 2nd_EL for capacitors may be disposed adjacent to each other. The first electrode bodies 1st_EL for capacitors may be disposed on a plurality of lines while being spaced apart from each other at regular intervals. The second electrode bodies 2nd_EL for capacitors may be disposed on a plurality of lines while being spaced apart from each other at regular intervals. The lines on which the first electrode bodies 1st_EL for capacitors are arranged and the lines on which the second electrode bodies 2nd_EL for capacitors are arranged may be adjacent to each other, and may be parallel to each other. The first electrode bodies 1st_EL for capacitors and the second electrode bodies 2nd_EL for capacitors may be disposed to be spaced apart from each other at regular intervals.

Referring to FIG. 3B, section A-A' is the section of the cell area Cell, and section B-B' may be the section of the contact area CT.

In the cell area Cell of the semiconductor device, a source line layer 101, a stacked body of which includes a plurality of gate conductive layers 123 and interlayer insulating layers 106 alternately stacked on the source line layer 101, channel plugs CP1 and CP2 vertically passing through the stacked body, of which includes a plurality of gate conductive layers 123 and interlayer insulating layers 106 alternately stacked, to contact the source line layer 101, second vertical structures VS2 vertically disposed at both ends of the stacked body to contact the source line layer 101, and a first vertical structure VS1 disposed to pass through portions of the stacked body disposed between the channel plugs CP1 and CP2 may be included.

The source line layer 101 may be a doped semiconductor layer, and may be, for example, a semiconductor layer doped with n-type impurities. In an embodiment, the source line layer 101 may be formed by injecting impurities into the surface of the substrate SUB, illustrated in FIG. 1A, or by depositing at least one doped silicon layer on the substrate SUB. In an embodiment, the source line layer 101 may be formed by forming an insulating layer on the peripheral circuit structure PC, illustrated in FIG. 1B, and thereafter depositing at least one doped silicon layer on the insulating layer.

The stacked body may have a structure in which a plurality of gate conductive layers 123 and interlayer insulating layers 106 are alternately stacked and in which the interlayer insulating layers 106 are disposed in lowermost and uppermost portions of the stacked body as illustrated, for example, in FIG. 3B. At least one gate conductive layer disposed in the lowermost portion, among the gate conductive layers 123, may be a source select line SSL, at least one gate conductive layer disposed in the uppermost portion, among the gate conductive layers 123, may be a drain select line DSL, and the remaining gate conductive layers may be word lines WL.

Each of the channel plugs CP1 and CP2 may be vertically arranged to pass through the stacked body, of which includes a plurality of gate conductive layers 123 and interlayer insulating layers 106 alternately stacked, and may include a channel layer 112 and a memory layer 111 enclosing the channel layer 112.

The first vertical structure VS1 may be disposed in the uppermost portion of the stacked body, of which includes a plurality of gate conductive layers 123 and interlayer insulating layers 106 alternately stacked, disposed between the channel plugs CP1 and CP2, and may be disposed to pass through at least one gate conductive layer 123 used as the drain select line DSL. That is, the first vertical structure VS1 may electrically isolate the gate conductive layer 123 for the drain select line DSL, which is coupled to the first channel plug CP1, from the gate conductive layer 123 for the drain select line DSL, which is coupled to the second channel plug CP2.

The contact area CT of the semiconductor device may include contact pad layers 103, first lines 104 for capacitors, second lines 105 for capacitors, isolation layers 102, which are disposed between the contact pad layers 103, the first lines 104 for capacitors, and the second lines 105 for capacitors, a dummy stacked body 110, which is stacked on the contact pad layers 103, the first lines 104 for capacitors, and the second lines 105 for capacitors, contact plugs CTP, which vertically pass through the dummy stacked body 110 to contact the contact pad layers 103, first electrode bodies 1st_EL for capacitors, which vertically pass through the dummy stacked body 110 to contact the first lines 104 for capacitors, and second electrode bodies 2nd_EL for capacitors, which vertically pass through the dummy stacked body 110 to contact the second lines 105 for capacitors.

The source line layer 101, the contact pad layers 103, the first lines 104 for capacitors, and the second lines 105 for capacitors may be formed on the same layer; and the contact pad layers 103, the first lines 104 for capacitors, and the second lines 105 for capacitors may be formed together during the process for forming the source line layer 101. The source line layer 101, the contact pad layers 103, the first lines 104 for capacitors, and the second lines 105 for capacitors may be formed of the same material. The isolation layers 102 may be disposed between the source line layer 101, the contact pad layers 103, the first lines 104 for capacitors, and the second lines 105 for capacitors, thus electrically isolating the source line layer 101, the contact pad layers 103, the first lines 104 for capacitors, and the second lines 105 for capacitors from each other. The plurality of first lines 104 for capacitors may be electrically connected to each other, and the plurality of second lines 105 for capacitors may be electrically connected to each other. The isolation layers 102 may be formed of an insulating layer, for example, an oxide layer. The contact pad layers 103, the first lines 104 for capacitors, and the second lines 105 for capacitors may be electrically connected to the peripheral circuit structure PC, illustrated in FIGS. 1A and 1B.

The dummy stacked body 110 may be a structure in which the plurality of interlayer insulating layers 106 and sacrificial layers 107 are alternately stacked, wherein each of the sacrificial layers 107 may be formed of an insulating layer having permittivity.

Each of the contact plugs CTP may be configured to include a conductive layer 114 for contact plugs and a barrier layer 113 enclosing the conductive layer 114 for contact plugs. Each of the first electrode bodies 1st_EL for capacitors and the second electrode bodies 2nd_EL for capacitors may include a conductive layer 116 for capacitors and a barrier layer 115 enclosing the conductive layer 116 for capacitors. The conductive layer 114 for contact plugs and the conductive layer 116 for capacitors may be made of the same material, and the barrier layer 113 and the barrier layer 115 may be made of the same material.

As described above, the first electrode bodies 1st_EL for capacitors and the second electrode bodies 2nd_EL for capacitors may be disposed around the contact plugs CTP, and each of the first electrode bodies 1st_EL for capacitors and the second electrode bodies 2nd_EL for capacitors may be formed in the shape of a vertical pillar passing through the dummy stacked body 110. For example, each of the first electrode bodies 1st_EL for capacitors and the second electrode bodies 2nd_EL for capacitors may be formed in the shape of a polygonal pillar including a cylinder or a square pillar. Different voltages may be respectively applied to the first electrode bodies 1st_EL for capacitors and the second electrode bodies 2nd_EL for capacitors during the operation of a semiconductor device, and then the first and second electrode bodies may be used as the corresponding capacitors.

FIGS. 4 to 10B are sectional views and plan views illustrating a method of manufacturing a semiconductor device according to an embodiment of the present disclosure.

Figure 4:
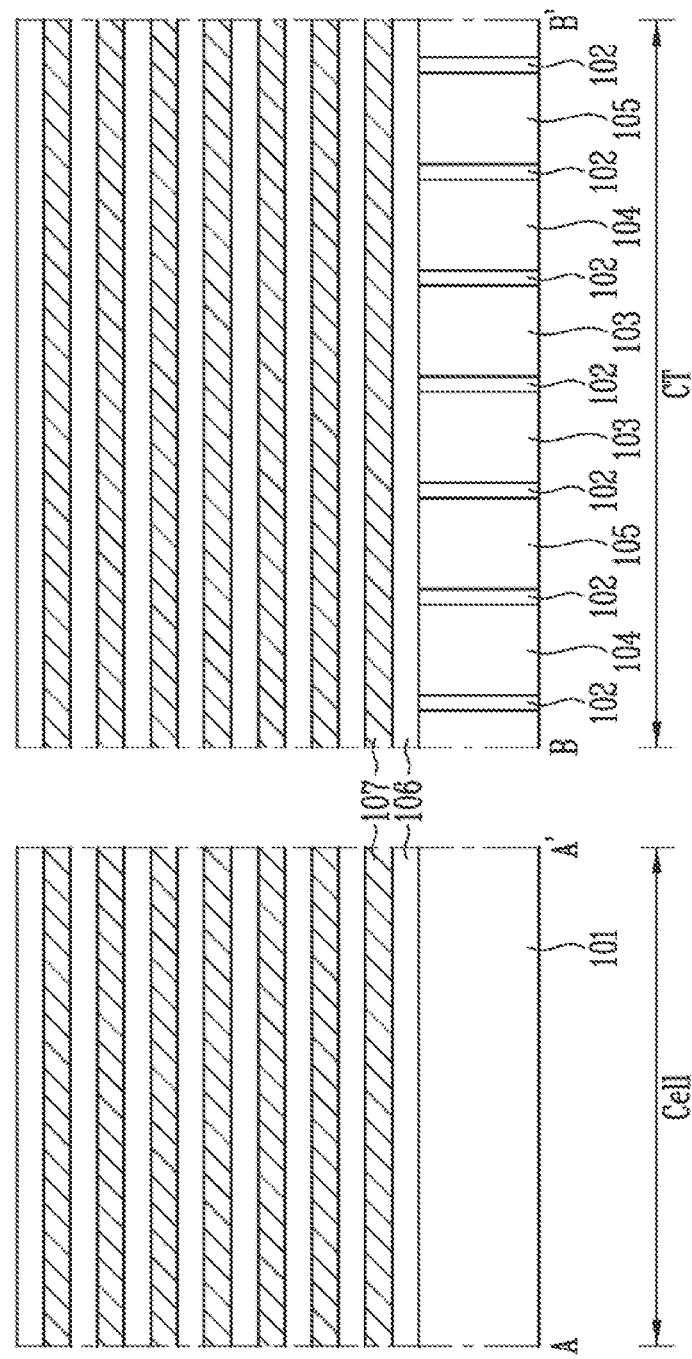

Referring to FIG. 4, a source line layer 101 is formed in the cell area Cell and the contact area CT of the semiconductor device. The source line layer 101 may be a doped semiconductor layer, and may be, for example, a semiconductor layer doped with n-type impurities. In an embodiment, the source line layer 101 may be formed by injecting impurities into the surface of the substrate SUB, illustrated in FIG. 1A, or by depositing at least one doped silicon layer on the substrate SUB. In an embodiment, the source line layer 101 may be formed by forming an insulating layer on the peripheral circuit structure PC, illustrated in FIG. 1B, and thereafter depositing at least one doped silicon layer on the insulating layer.

Thereafter; partial regions of the source line layer formed in the contact area CT are etched, and isolation layers 102 are formed by filling the etched partial regions with an insulating layer. The source line layer in the contact area CT may be defined as contact pad layers 103, first lines 104 for capacitors, and second lines 105 for capacitors by the isolation layers 102. Each of the isolation layers 102 may be formed of an insulating layer, for example, an oxide layer.

Thereafter, a stacked body in which first material layers 106 and second material layers 107 are alternately stacked in the cell area Cell and the contact area CT is formed. The second material layers 107 are configured to form conductive layers such as word lines, select lines, and pads, and the first material layers 106 are configured to insulate the stacked conductive layers from each other. The first material layers 106 and the second material layers 107 formed in the contact area CT may be used as dielectric layers of the capacitors.

The first material layers 106 may be formed of a material having etch selectivity higher than that of the second material layers 107. For example, each of the first material layers 106 may include an insulating material such as oxide, and each of the second material layers 107 may include a sacrificial material such as nitride.

Figure 5A:
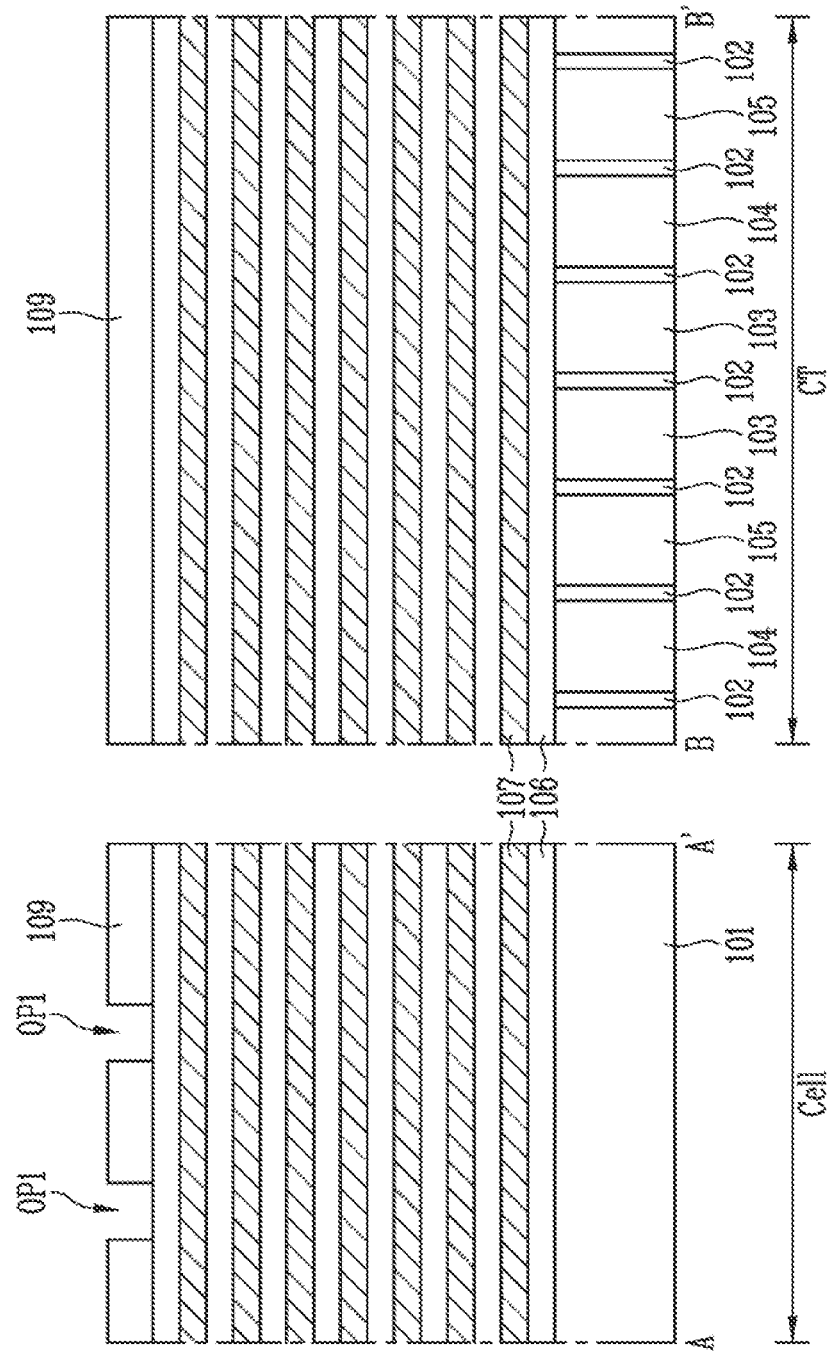

Referring to FIGS. 5A and 5B, a first mask pattern 109 is formed on the stacked body, of which includes a plurality of first material layers 106 and second material layers 107 alternately stacked, in the cell area Cell and the contact area CT. The first mask pattern 109 is formed such that portions in which channel plugs are to be formed in the cell area Cell have first openings OP1.

Figure 6A:
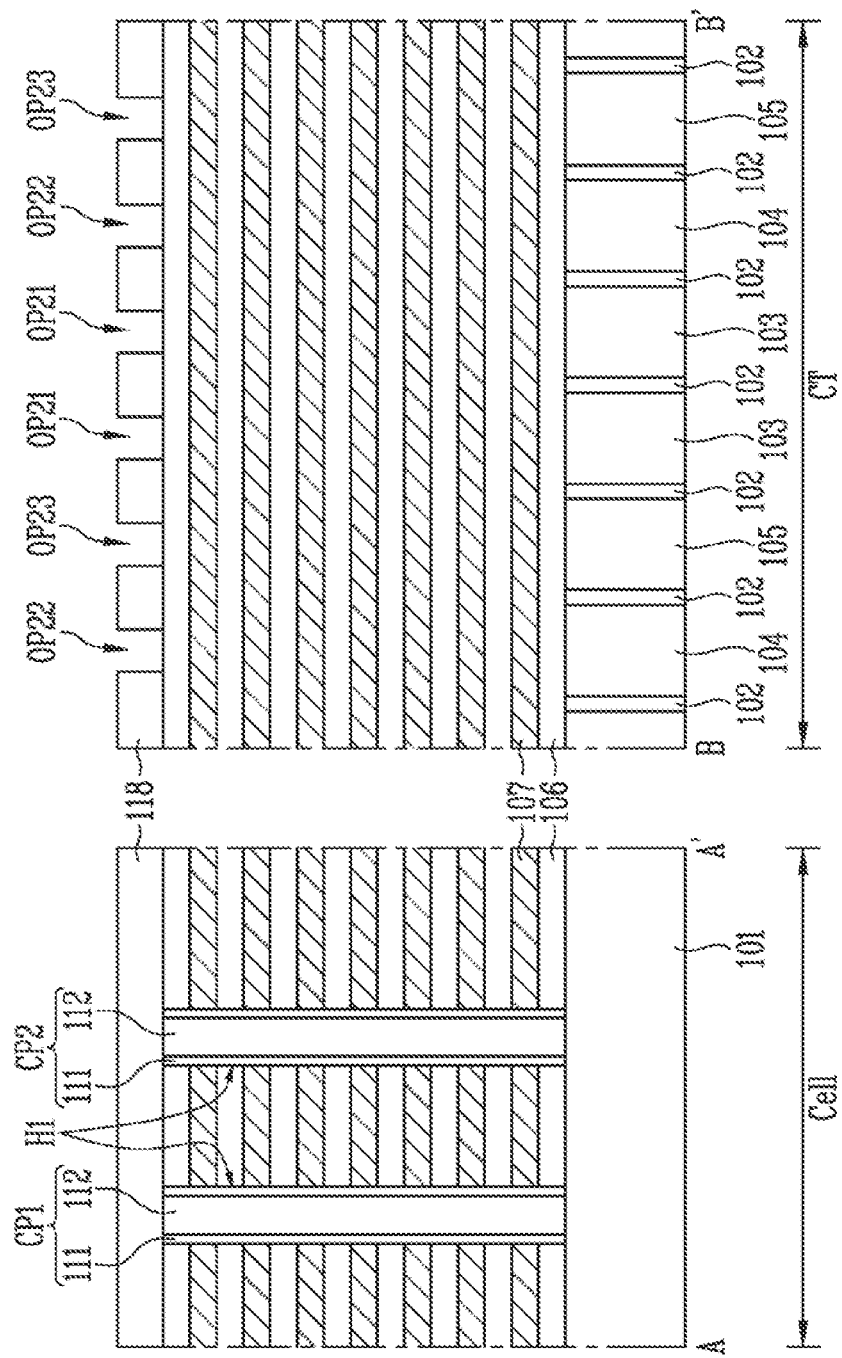

Referring to FIGS. 6A and 6B, first holes H1 passing through the stacked body, of which includes a plurality of first material layers 106 and second material layers 107 alternately stacked, are formed by etching the stacked body using the first mask pattern 109 as a barrier. Here, the contact area CT is prevented or mitigated from being etched by the first mask pattern 109, and thus holes are not formed in the contact area CT.

Thereafter, the first mask pattern 109 is removed.

Then, channel plugs CP1 and CP2, each including a channel layer 112 and a memory layer 111 enclosing the channel layer 112, are formed inside the holes H1. For example, the memory layers 111 are formed on side walls of the first holes H1. Each of the memory layers 111 may include at least one of a charge blocking layer, a data storage layer; and a tunnel insulating layer, and the data storage layer may include a floating-gate material such as silicon, a charge-trap material such as nitride, a phase-change material, nanodots, or the like. Thereafter, the channel plugs CP1 and CP2 are formed by completely filling or substantially filling the first holes H1 with the channel layers 112 up to the central regions of the first holes H1. In other embodiments, the channel layers 112 may be formed in a structure in which central regions of the first holes H1 are open, and gap-fill layers may be formed in the open central regions.

Thereafter, a second mask pattern 118 may be formed on the top of the channel plugs CP1 and CP2 and the stacked body, of which includes a plurality of first material layers 106 and second material layers 107 alternately stacked, in the cell area Cell and the top of the stacked body in the contact area CT. The second mask pattern 118 is formed such that portions in which contact plugs are to be formed and portions in which first electrode bodies and second electrode bodies for capacitors are to be formed in the contact area CT have second openings OP21 to OP23, respectively. For example, the second openings OP21 corresponding to the contact plugs may be formed in a hole type, and the second openings OP22 and OP23 corresponding to the first electrode bodies and the second electrode bodies for capacitors may also be formed in a hole type.

The second openings OP22 corresponding to the first electrode bodies for capacitors may be arranged on a plurality of first lines, and the second openings OP23 corresponding to the second electrode bodies for capacitors may be arranged on a plurality of second lines. The plurality of first lines and the plurality of second lines may be alternately arranged.

In an embodiment of the present disclosure, although the case where the second openings OP21 to OP23 are formed in a rectangular hole type is described by way of example, the present disclosure is not limited thereto, and may be formed in various patterns such as circular, elliptical and lozenge-shaped patterns etc.

Referring to FIG. 7, contact holes CTH and capacitor electrode holes CPH which pass through the stacked body, of which includes a plurality of first material layers 106 and second material layers 107 alternately stacked, are formed by etching the stacked body in the contact area CT using the second mask pattern 118 as a barrier. Here, the cell area Cell is prevented from being etched by the second mask pattern 118.

Thereafter, the second mask pattern 118 may be removed.

Next, barrier layers 113 are formed on the sidewalls of the contact holes CTH, and contact plugs CTP to be coupled to the contact pad layers 103 are formed by filling the contact holes CTH with conductive layers 114 for contact plugs. Here, barrier layers 115 and conductive layers 116 for capacitors are also formed in the capacitor electrode holes CPH, whereby first electrode bodies 1st_EL for capacitors and second electrode bodies 2nd_EL for capacitors may be formed. The barrier layers 113 formed on the sidewalls of the contact holes CTH and the barrier layers 115 formed on the sidewalls of the capacitor electrode holes CPH may be made of the same material formed in the same process, and the conductive layers 114 for contact plugs formed inside the contact holes CTH and the conductive layers 116 for capacitors formed inside the capacitor electrode holes CPH may be made of the same material formed in the same process.

Referring to FIGS. 8A and 8B, a third mask pattern 117 is formed on the tops of the channel plugs CP1 and CP2 and the stacked body, of which includes a plurality of first material layers 106 and second material layers 107 alternately stacked, in the cell area Cell and the tops of the contact plugs CTP, the first electrode bodies 1st_EL for capacitors, the second electrode bodies 2nd_EL for capacitors, and the stacked body in the contact area CT. The third mask pattern 117 may be a mask pattern for forming a first vertical structure. The third mask pattern 117 may be formed to have a third opening OP3 through which a portion in which a region between the channel plugs CP1 and CP2 is to be formed in the cell area Cell is open. The third opening OP3 corresponding to the region in which the first vertical structure is to be formed may be formed in a linear shape, as illustrated in FIG. 8B.

Figure 9:
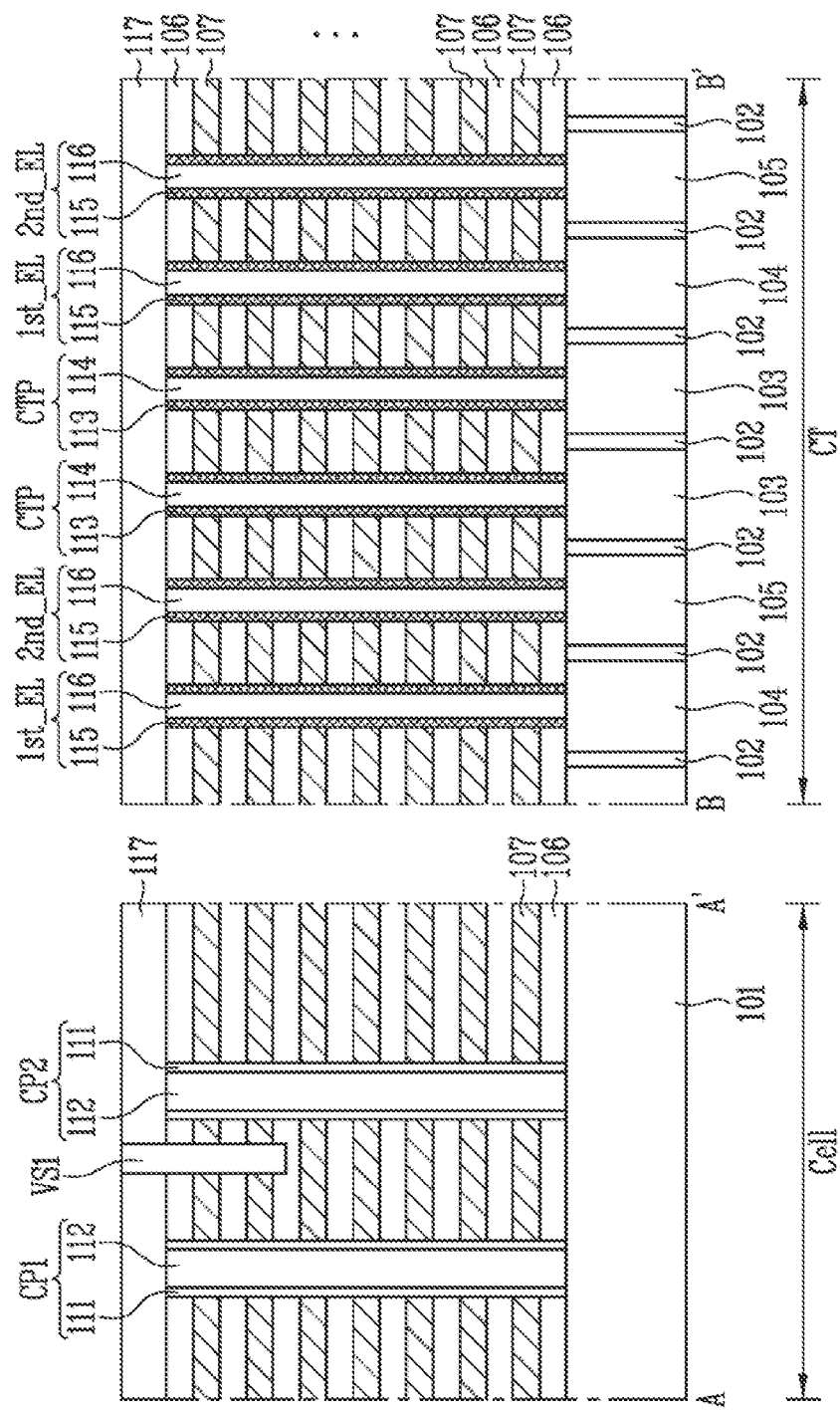

Referring to FIG. 9, a first slit may be formed by etching part of the upper portion of the stacked body, of which includes a plurality of first material layers 106 and second material layers 107 alternately stacked, formed between the channel plugs CP1 and CP2 of the cell area Cell using the third mask pattern 117 as an etching mask pattern, and the first vertical structure VS1 is formed by filling the first slit with an insulating layer. The first vertical structure VS1 may be formed to pass through one or more second material layers 107 disposed in the uppermost portion of the stacked body, of which includes a plurality of first material layers 106 and second material layers 107 alternately stacked, in which a drain select line is to be formed.

Figure 10A:
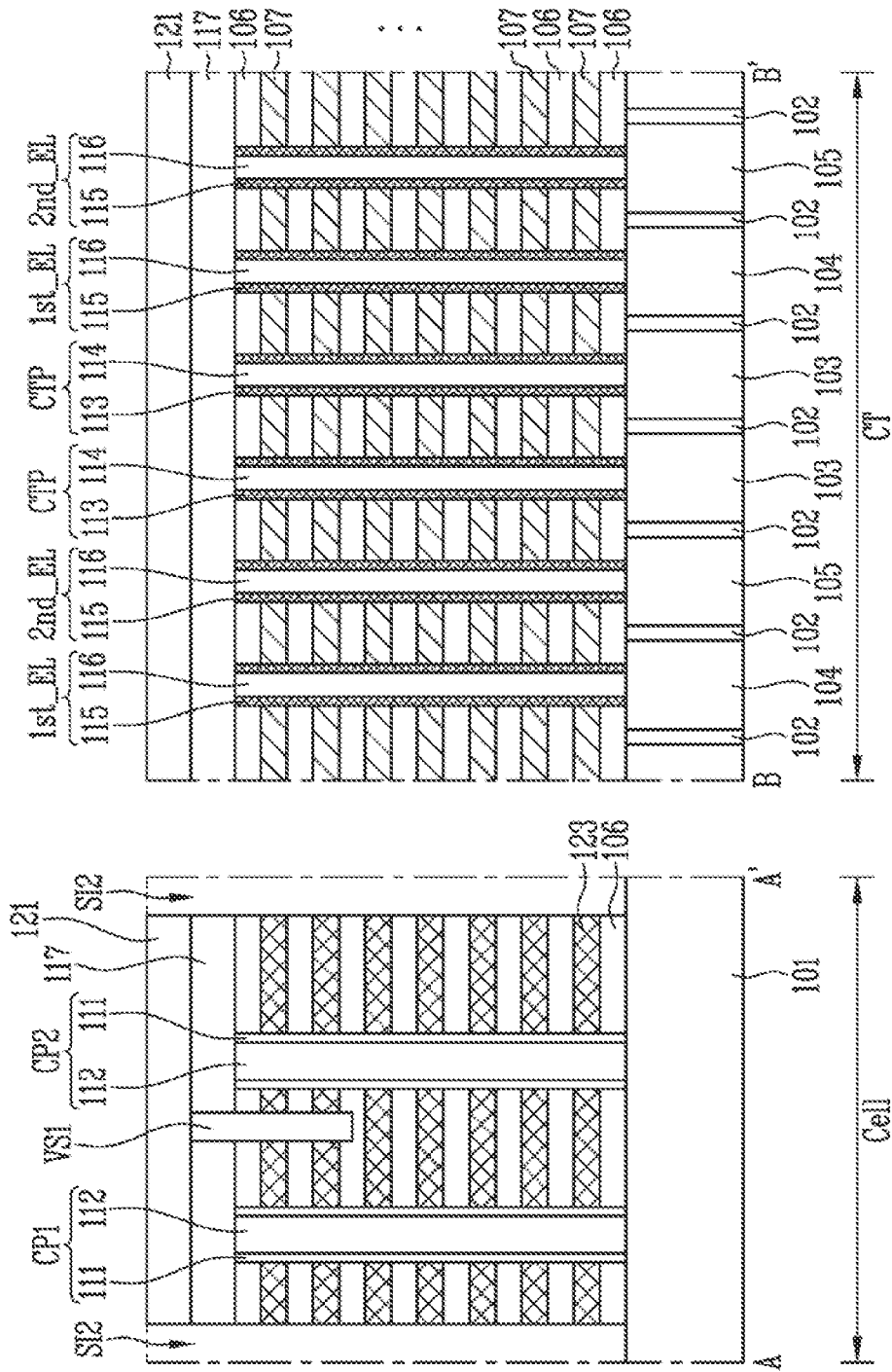

Referring to FIGS. 10A and 10B, a fourth mask pattern 121 is formed on the top of the third mask pattern 117 in the cell area Cell and the contact area CT. The fourth mask pattern 121 is formed to have fourth openings OP4 through which both ends of the region in which the channel plugs CP1 and CP2 are disposed in the cell area Cell are open. That is, the fourth mask pattern 121 is formed to have the fourth openings OP4, through which the region in which the second vertical structures are to be formed is open, at both ends of the region in which the channel plugs CP1 and CP2 are disposed. The fourth openings OP4 of the region in which the second vertical structures are to be formed may be formed in a linear shape, as illustrated in FIG. 10B, wherein the fourth openings OP4 may be arranged either parallel to each other or perpendicular to each other. Further, the fourth openings OP4 may be formed in various shapes according to embodiments.

Thereafter, second slits 512 may be formed by etching the third mask pattern 117 and the stacked body, of which includes a plurality of first material layers 106 and second material layers 107 alternately stacked, formed at both ends of the region in which the channel plugs CP1 and CP2 are disposed in the cell area Cell using the fourth mask pattern 121 as a barrier. The second slits 512 causes the sidewalls of the first material layers 106 and the second material layers (i.e., 107 of FIG. 9) to be exposed by etching the stacked body.

Thereafter, the second material layers 107, the sidewalls of which are exposed through the second slits 512 in the cell area, are removed. Here, it is desirable that the second material layers 107 in the contact area CT should not be removed.

Next, in the cell area Cell, gate conductive layers 123 are formed in spaces from which the second material layers are removed. Among the gate conductive layers 123, at least one gate conductive layer 123 that is disposed in the lowermost portion may be a lower select line (i.e., a source select line), at least one gate conductive layer 123 that is disposed in the uppermost portion and is separated by the first vertical structure VS1 may be an upper select line (i.e., a drain select line), and the remaining gate conductive layers 123 may be word lines.

At the above-described process steps, an embodiment in which the fourth mask pattern 121 is formed on the third mask pattern 117 has been described, but, in other embodiments, the third mask pattern 117 is removed, after which the fourth mask pattern 121 may be formed on the top of the entire structure.

In accordance with the above-described embodiment, during the process for forming contact plugs in the contact area, a plurality of first electrode bodies and second electrode bodies for capacitors may be formed around the contact plugs.

Figure 11:
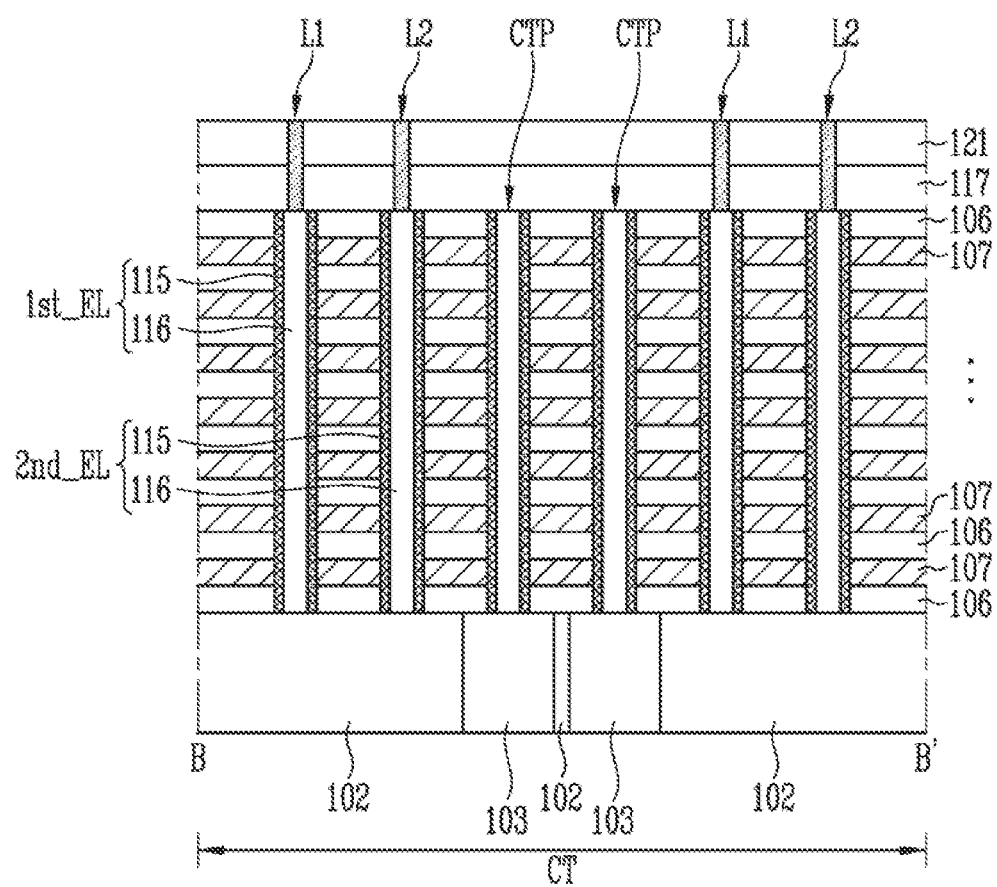
FIG. 11 is a plan view illustrating a semiconductor device according to an embodiment of the present disclosure.

FIG. 11 is a plan view illustrating a semiconductor device according to an embodiment of the present disclosure.

Referring to FIG. 11, the contact area CT of the semiconductor device may include contact pad layers 103, isolation layers 102 which are disposed between the contact pad layers 103 and disposed below first and second electrode bodies 1st_EL and 2nd_EL for capacitors, a dummy stacked body, of which includes a plurality of first material layers 106 and second material layers 107 alternately stacked, which is disposed on the contact pad layers 103 and the isolation layers 102, contact plugs CTP which vertically pass through the dummy stacked body to contact the contact pad layers 103, the first and second electrode bodies 1st_EL and 2nd_EL for capacitors, which vertically pass through the dummy stacked body to contact the isolation layers 102, the third mask pattern 117 and the fourth mask pattern 121 which are formed on the top of the dummy stacked body, first lines L1 for capacitors, which pass through the third mask pattern 117 and the fourth mask pattern 121 and are coupled to the first electrode bodies 1st_EL for capacitors, and second lines L2 for capacitors, which pass through the third mask pattern 117 and the fourth mask pattern 121 and are coupled to the second electrode bodies 2nd_EL for capacitors.

As described above, in the semiconductor device, the first lines L1 for capacitors and the second lines L2 for capacitors, which are directly coupled to the tops of the first electrode bodies 1st_EL for capacitors and the second electrode bodies 2nd_EL for capacitors, respectively, may be disposed.

Figure 12:
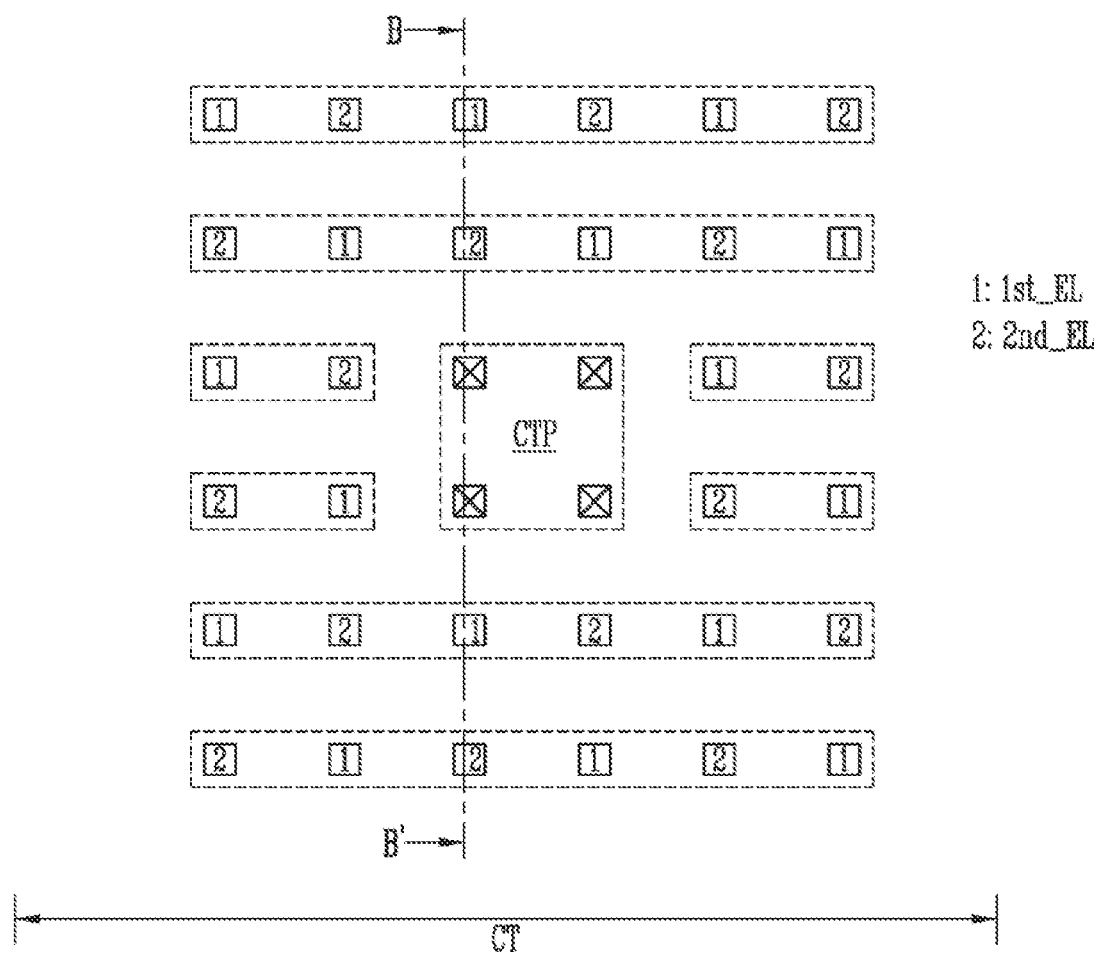
FIG. 12 is a plan view illustrating a semiconductor device according to an embodiment of the present disclosure.

FIG. 12 is a plan view illustrating a semiconductor device according to an embodiment of the present disclosure.

Referring to FIG. 12, one or more contact plugs CTP may be arranged in a contact area CT. Further, in the contact area CT, one or more first electrode bodies 1st_EL for capacitors and one or more second electrode bodies 2nd_EL for capacitors may be arranged. The first electrode bodies 1st_EL for capacitors and the second electrode bodies 2nd_EL for capacitors may be arranged to enclose the perimeter of the contact plugs CTP. The first electrode bodies 1st_EL for capacitors and the second electrode bodies 2nd_EL for capacitors may be alternately arranged on the same line. One first electrode body 1st_EL for capacitors may be enclosed with a plurality of second electrode bodies 2nd_EL for capacitors. One second electrode body 2nd_EL for capacitors may be enclosed with a plurality of first electrode bodies 1st_EL for capacitors.

Figure 13:
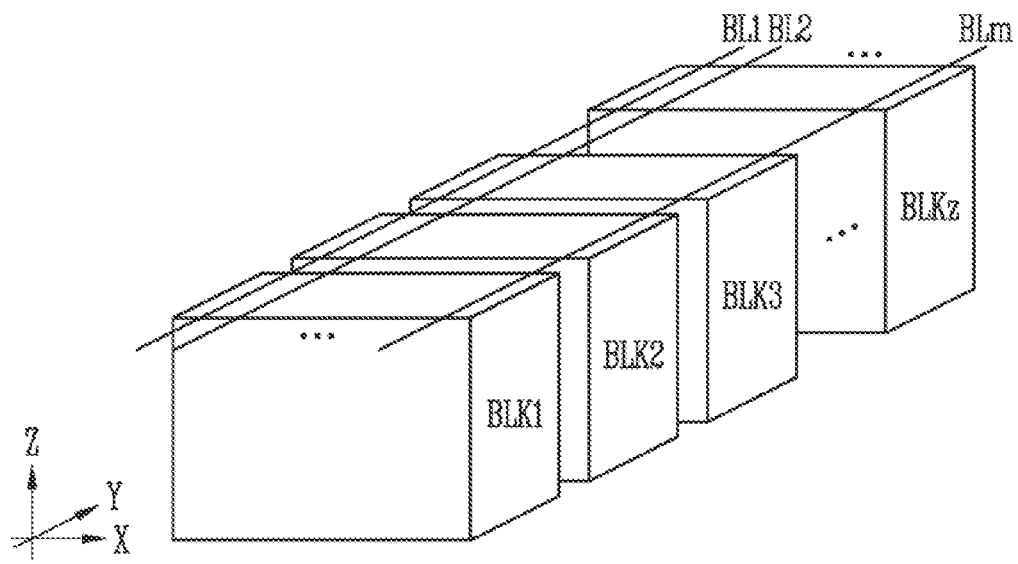
FIG. 13 is a diagram illustrating memory blocks included in a semiconductor device according to an embodiment of the present disclosure.

FIG. 13 is a diagram illustrating memory blocks included in a semiconductor device according to an embodiment of the present disclosure.

The semiconductor device may include a plurality of memory blocks BK1 to BLKz. The plurality of memory blocks BLK1 to BLKz may be arranged in a second direction Y in which bit lines BL1 to BLm extend, and may be spaced apart from each other. For example, the first to z-th memory blocks BLK1 to BLKz may be arranged in the second direction Y, and may be spaced apart from each other, wherein each of the first to z-th memory blocks BLK1 to BLKz may include a plurality of memory cells stacked in a third direction Z. Here, the first to z-th memory blocks BLK1 to BLKz may be spaced apart from each other using a slit.

Figure 14:
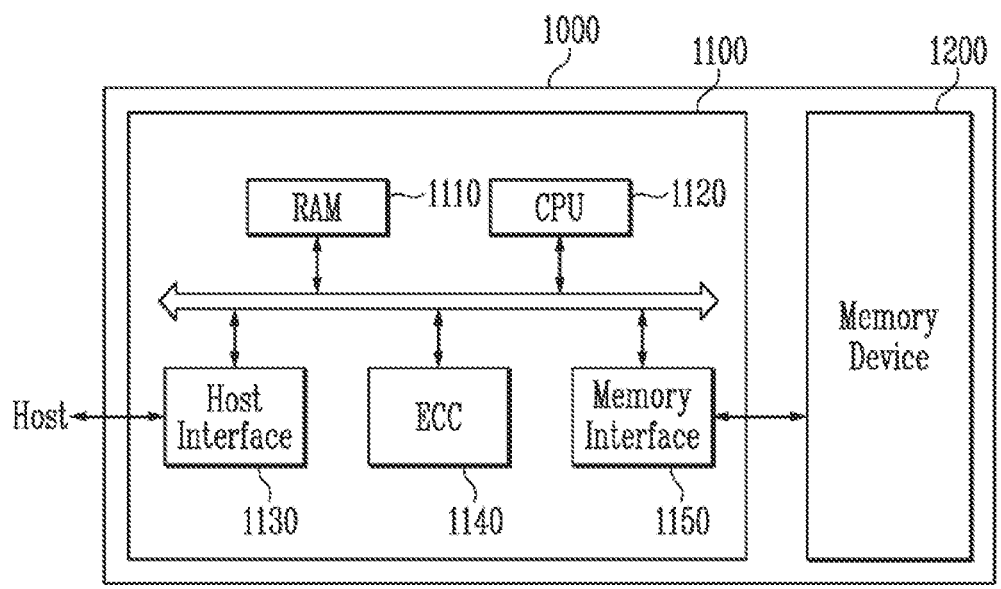
FIG. 14 is a block diagram illustrating the configuration of a memory system according to an embodiment of the present disclosure.

FIG. 14 is a block diagram illustrating the configuration of a memory system according to an embodiment of the present disclosure.

Referring FIG. 14, a memory system 1000 according to the embodiment of the present disclosure includes a memory device 1200 and a controller 1100.

The memory device 1200 is used to store data information having a variety of data forms such as text data, graphics data, and software codes. The memory device 1200 may be the semiconductor device, described above with reference to FIGS. 1A, 1B, 2, 3A, and 3B, or FIG. 11 or 12, and may be manufactured based on the manufacturing method, described above with reference to FIGS. 4 to 10B. Since the structure of the memory device 1200 and the method of manufacturing the memory device 1200 are the same as those described above, detailed descriptions thereof will be omitted.

The controller 1100 may be coupled to a host and the memory device 1200, and may access the memory device 1200 in response to a request received from the host. For example, the controller 1100 may control read, write, erase, and background operations of the memory device 1200.

The controller 1100 includes a random access memory (RAM) 1110, a central processing unit (CPU) 1120, a host interface 1130, an error correction code (ECC) circuit 1140, a memory interface 1150, etc.

Here, the RAM 1110 can be used as a working memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control the overall operation of the controller 1100. For example, the CPU 1120 may run firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA (SATA) protocol, a parallel-ATA (DATA) protocol, a small computer system interface (SCSI) protocol, an enhanced small disk interface (ESDI) protocol, an integrated drive electronics (IDE) protocol, and a private protocol.

The ECC circuit 1140 uses an error correction code (ECC) to detect and correct errors in data read from the memory device 1200.

The memory interface 1150 may interface with the memory device 1200. For example, the memory interface 1150 includes a NAND interface or a NOR interface.

For reference, the controller 1100 may further include a buffer memory (not illustrated) for temporarily storing data. Here, the buffer memory may be used to temporarily store data to be transferred to an external device through the host interface 1130 or data transferred from the memory device 1200 through the memory interface 1150. The controller 1100 may further include a ROM which stores code data required to interface with the host.

As described above, since the memory system 1000 according to the embodiment of the present disclosure includes the memory device 1200 having an improved integration degree and improved characteristics, the integration degree and characteristics of the memory system 1000 may also be improved.

Figure 15:
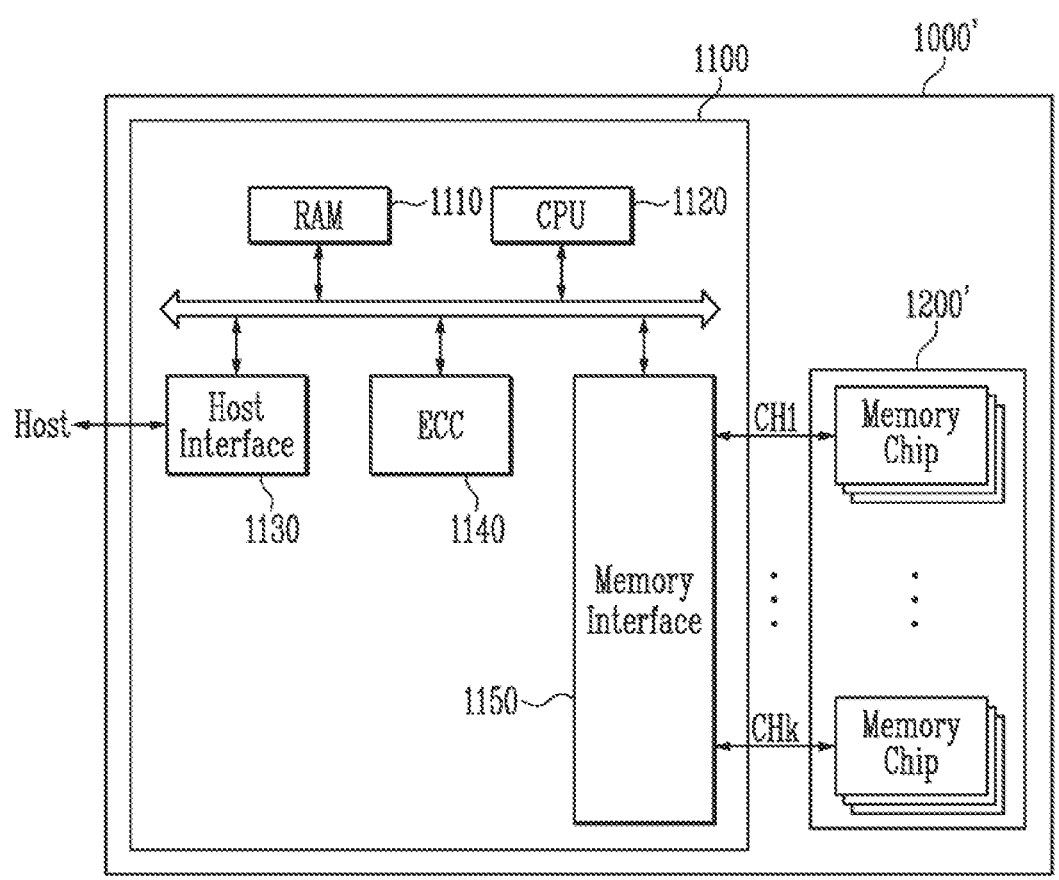
FIG. 15 is a block diagram illustrating the configuration of a memory system according to an embodiment of the present disclosure.

FIG. 15 is a block diagram illustrating the configuration of a memory system according to an embodiment of the present disclosure. Hereinafter, repetitive descriptions identical to the above descriptions will be omitted.

Referring FIG. 15, a memory system 1000' according to the embodiment of the present disclosure includes a memory device 1200' and a controller 1100. Also, the controller 1100 includes a RAM 1110, a CPU 1120, a host interface 1130, an ECC circuit 1140, a memory interface 1150, etc.

The memory device 1200' may be a nonvolatile memory, and may be a semiconductor device, described above with reference to FIGS. 1A, 1B, 2, 3A, and 3B, or FIG. 11 or 12. The memory device 1200' may be manufactured based on the manufacturing method, described above with reference to FIGS. 4 to 10B. Since the structure of the memory device 1200' and the method of manufacturing the memory device 1200' are the same as those described above, detailed descriptions thereof will be omitted.

Further, the memory device 1200' may be a multi-chip package composed of a plurality of memory chips. The plurality of memory chips may be divided into a plurality of groups. The plurality of groups may communicate with the controller 1100 through first to k-th channels CH1 to CHk. Furthermore, the memory chips belonging to one group may communicate with the controller 1100 through a common channel. For reference, the memory system 1000' may be modified such that one memory chip is coupled to one channel.

As described above, since the memory system 1000' according to the embodiment of the present disclosure includes the memory device 1200' having an improved integration degree and improved characteristics, the integration degree and characteristics of the memory system 1000' may also be improved. In particular, the memory device 1200' is configured in a multi-chip package, whereby the data storage capacity of the memory system 1000' may be increased, and the operating speed thereof may be enhanced.

Figure 16:
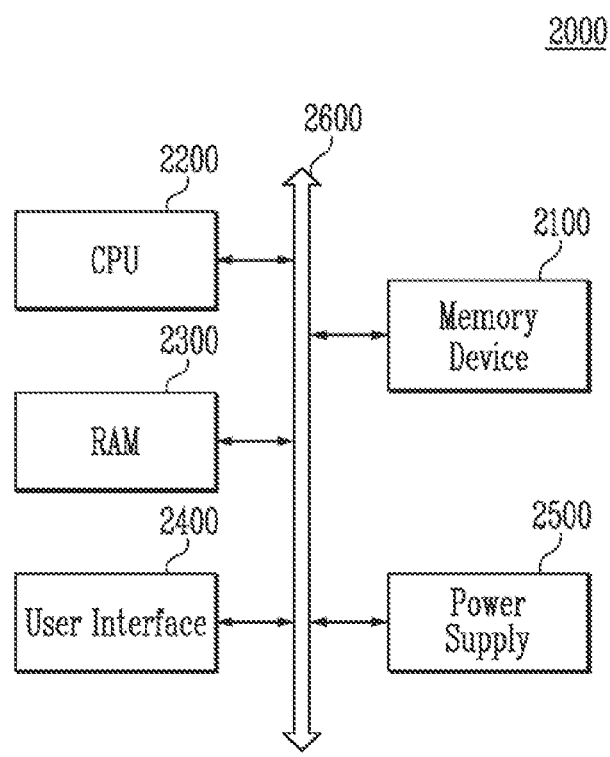
FIG. 16 is a block diagram illustrating the configuration of a computing system according to an embodiment of the present disclosure.

FIG. 16 is a block diagram illustrating the configuration of a computing system according to an embodiment of the present disclosure. Hereinafter, repetitive descriptions identical to the above descriptions will be omitted.

Referring to FIG. 16, a computing system 2000 according to an embodiment of the present disclosure includes a memory device 2100, a CPU 2200, a RAM 2300, a user interface 2400, a power supply 2500, a system bus 2600, etc.

The memory device 2100 stores data provided via the user interface 2400, data processed by the CPU 2200, etc. Further, the memory device 2100 is electrically connected to the CPU 2200, the RAM 2300, the user interface 2400, the power supply 2500, etc, through the system bus 2600. For example, the memory device 2100 may be coupled to the system bus 2600 either through a controller (not illustrated) or directly. In the case where the memory device 2100 is directly coupled to the system bus 2600, the function of the controller may be performed by the CPU 2200, the RAM 2300, etc.

Here, the memory device 2100 may be a nonvolatile memory, and may be a semiconductor device, described above with reference to FIGS. 1A, 1B, 2, 3A, and 3B, or FIG. 11 or 12. The memory device 2100 may be manufactured based on the manufacturing method, described above with reference to FIGS. 4 to 10B. Since the structure of the memory device 2100 and the method of manufacturing the memory device 2100 are the same as those described above, detailed descriptions thereof will be omitted.

Furthermore, the memory device 2100 may be a multi-chip package composed of a plurality of memory chips, as described above with reference to FIG. 15.

The computing system 2000 having the above-mentioned configuration may be provided as one of various elements of an electronic device such as a computer, a ultra mobile PC (UMPC), a workstation, a net-book, a personal digital assistant (PDA), a portable computer, a web tablet, a wireless phone, a mobile phone, a smart phone, an electronic book (e-book), a portable multimedia player (PMP), a portable game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment of the present disclosure includes the memory device 2100 having an improved integration degree and improved characteristics, the integration degree and characteristics of the computing system 2000 may also be improved.

Figure 17:
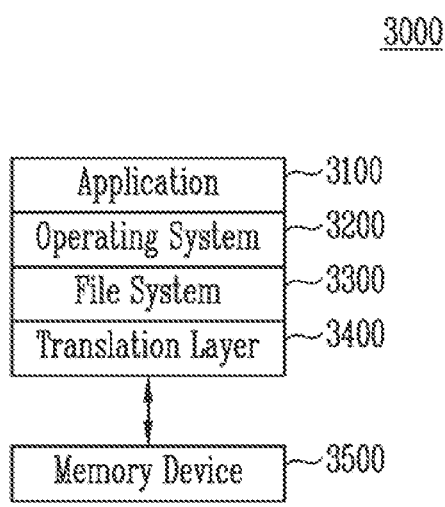
FIG. 17 is a block diagram illustrating a computing system according to an embodiment of the present disclosure.

FIG. 17 is a block diagram illustrating a computing system according to an embodiment of the present disclosure.

Referring to FIG. 17, a computing system 3000 according to an embodiment of the present disclosure includes a software layer which includes an operating system 3200, an application 3100, a file system 3300, a translation layer 3400, etc. Also, the computing system 3000 includes a hardware layer such as a memory device 3500.

The operating system 3200, which is configured to manage software resources, hardware resources, etc. of the computing system 3000, may control the execution of programs by the CPU. The application 3100 may be any of various applications to be executed in the computing system 3000, and may be a utility to be executed by the operating system 3200.

The file system 3300 may refer to a logical structure for controlling data, files, etc. which are present in the computing system 3000, and may organize files or data to be stored in the memory device 3500 based on rules. The file system 3300 may be determined depending on the operating system 3200 that is used in the computing system 3000. For example, if the operating system 3200 is a Microsoft Windows-based operating system, the file system 3300 may be a file allocation table (FAT), an NT file system (NTFS), or the like. Further, if the operating system 3200 is a Unix/Linux-based operating system, the file system 3300 may be an Extended File System (EXT), a Unix File System (UFS), a Journaling File System (JFS), or the like.

Although the operating system 3200, the application 3100, and the file system 3300 are illustrated as being separate blocks in the drawing, the application 3100 and the file system 3300 may be included in the operating system 3200.

The translation layer 3400 translates an address into a form suitable for the memory device 3500 in response to a request received from the file system 3300. For example, the translation layer 3400 translates a logical address generated by the file system 3300 into a physical address of the memory device 3500. Here, information about mapping between the logical address and the physical address may be stored in an address translation table. For example, the translation layer 3400 may be a flash translation layer (FTL), a universal flash storage link layer (ULL), or the like.

The memory device 3500 may be a nonvolatile memory, and may be a semiconductor device, described above with reference to FIGS. 1A, 1B, 2, 3A, and 3B, or FIG. 11 or 12. The memory device 3500 may be manufactured based on the manufacturing method, described above with reference to FIGS. 4 to 10B. Since the structure of the memory device 3500 and the method of manufacturing the memory device 1200 are the same as those described above, detailed descriptions thereof will be omitted.

The computing system 3000 having the above-mentioned configuration may be divided into an operating system layer executed in an upper level region and a controller layer executed in a lower level region. Here, the application 3100, the operating system 3200, and the file system 3300 may be included in the operating system layer, and may be executed by a working memory of the computing system 3000. Further, the translation layer 3400 may be included in the operating system layer or the controller layer.

As described above, since the computing system 3000 according to an embodiment of the present disclosure includes the memory device 3500 having an improved integration degree and improved characteristics, the integration degree and characteristics of the computing system 3000 may also be improved.

In accordance with the present disclosure, in an embodiment, during a process for forming a contact in a contact area, electrodes for capacitors may be formed together with the contact, thus facilitating a manufacturing process and improving the degree of integration.

What is claimed is:

1. A semiconductor device, comprising:
   a dummy stacked body including a plurality of first material layers and second material layers alternately stacked in a contact area;
   at least one contact plug formed to vertically pass through a portion or an entirety of the dummy stacked body; and
   a capacitor comprising a first electrode body and a second electrode body, the first and second electrode bodies formed around the at least one contact plug and vertically passed through a portion or an entirety of the dummy stacked body.

2. The semiconductor device according to claim 1, wherein the first electrode body and the second electrode body each have a vertical pillar shape.

3. The semiconductor device according to claim 1, further comprising:
   one or more first electrode bodies and one or more second electrode bodies,
   wherein the first electrode bodies and the second electrode bodies are arranged to neighbor each other and are spaced apart from each other at regular intervals.

4. The semiconductor device according to claim 1, further comprising:
   a first line of electrode bodies comprising one or more first electrode bodies.

5. The semiconductor device according to claim 4, further comprising:
   a second line of electrode bodies comprising one or more second electrode bodies.

6. The semiconductor device according to claim 5, wherein the first line of electrode bodies and the second line of electrode bodies are adjacent to each other and are substantially parallel to each other.

7. The semiconductor device according to claim 1, further comprising:
   a line of electrode bodies comprising one or more first electrode bodies and one or more second electrode bodies, wherein each of the first electrode bodies and each of the second electrode bodies are alternately arranged.

8. The semiconductor device according to claim 1, further comprising:
   a first line disposed below the dummy stacked body and directly coupled to the first electrode body; and
   a second line disposed below the dummy stacked body and directly coupled to the second electrode body.

9. The semiconductor device according to claim 1, further comprising:
   a first line disposed on the dummy stacked body and directly coupled to the first electrode body; and
   a second line disposed on the dummy stacked body and directly coupled to the second electrode body.

10. The semiconductor device according to claim 1, wherein each of the first electrode body and the second electrode body have at least one of substantially a cylinder shape and substantially a square pillar shape.

* * * * *